(12) United States Patent
Chang et al.

(10) Patent No.: US 9,213,800 B1
(45) Date of Patent: Dec. 15, 2015

(54) OPTICAL PROXIMITY CORRECTION VERIFICATION SYSTEM AND VERIFICATION METHOD THEREOF

(71) Applicant: UNITED MICROELECTRONICS CORP., Hsin-Chu (TW)

(72) Inventors: Chung-Chih Chang, Taichung (TW); Kuo-Hsun Huang, Miaoli County (TW); Chao-Yao Chiang, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/474,180

(22) Filed: Aug. 31, 2014

(30) Foreign Application Priority Data

Jul. 24, 2014  (TW) .............................. 103125327 A

(51) Int. Cl.
*G06F 17/50* (2006.01)
(52) U.S. Cl.
CPC .................................. *G06F 17/5081* (2013.01)
(58) Field of Classification Search
CPC ....... G03F 1/36; G03F 7/705; G03F 7/70441; G06F 17/5081; G06F 2217/12; G06F 17/5068; G06F 17/5022; G06F 17/50; G06F 17/5045; G06F 2217/06; G06F 2217/10; G06F 2217/84; G06F 17/5036; G06F 19/00
USPC ....................................................... 716/50–56
See application file for complete search history.

(56) References Cited

U.S. PATENT DOCUMENTS

| 7,266,801 B2 * | 9/2007 | Kotani et al. ................... 716/52 |
| 2006/0265675 A1 * | 11/2006 | Wang ................................ 716/5 |

\* cited by examiner

*Primary Examiner* — Binh Tat
(74) *Attorney, Agent, or Firm* — Winston Hsu; Scott Margo

(57) ABSTRACT

The optical proximity correction verification method includes loading a layout data to be verified to a processor, loading a reference layout data to the processor. The processor performs a first stage Boolean operation on the layout data to be verified to generate first verified data. The processor performs a layout versus layout verification on the first verified data to generate second verified data by using the reference layout data. If the layout versus layout verification is successfully performed, the processor performs a second stage Boolean operation on the second verified data to generate third verified data. By using the reference layout data, the processor performs a Boolean check on the third verified data to generate fourth verified data.

10 Claims, 8 Drawing Sheets

OPTICAL PROXIMITY CORRECTION VERIFICATION SYSTEM AND VERIFICATION METHOD THEREOF

BACKGROUND OF THE INVENTION

1. Field of the Invention

The present invention illustrates an optical proximity correction verification method, and more particularly, the verification method using two stages of Boolean operations.

2. Description of the Prior Art

With the advancement of integrated circuit development, component miniaturization and densification are inevitable trends. In the process for manufacturing the integrated circuit, optical micro-lithography is a critical step to determine the performance of the components. To avoid critical dimension variation when transferring the manufactured optical mask, an optical proximity correction is used to guarantee that the performance and completeness of the layout of the manufactured optical mask are satisfactory. Conventional optical proximity correction verification method includes the steps of Boolean operation and Boolean check for verifying if all parameters used in optical proximity correction conform to their predesigned definitions.

However, some unexpectable and undetectable errors are occurred for the conventional optical proximity correction verification in certain special cases. Such undetectable errors affect the performance for outputting the layout of optical mask. Thus, to develop an optical proximity correction verification method being capable of reducing undetectable errors is important.

SUMMARY OF THE INVENTION

In an embodiment of the present invention, an optical proximity correction verification method is disclosed. The method includes loading a layout data to be verified to a processor, loading a reference layout data to the processor, the processor performing a first stage Boolean operation on the layout data to generate a first verified data, the processor performing a layout versus layout verification on the first verified data by using the reference layout data to generate a second verified data, the processor performing a second stage Boolean operation on the second verified data to generate a third verified data if the layout versus layout verification is successfully performed, the processor performing a Boolean check on the third verified data to generate a fourth verified data by using the reference layout data.

In another embodiment of the present invention, an optical proximity correction verification system is disclosed. The system includes a first memory segment, a second memory segment, and a processor. The first memory segment is used for loading a layout data to be verified. The second memory segment is used for loading a reference layout data. A processor is coupled to the first memory segment and the second memory segment, wherein the processor performs a first stage Boolean operation on the layout data to be verified to generate a first verified data, the processor performs a layout versus layout verification on the first verified data to generate a second verified data by using the reference layout data, the processor performs a second stage Boolean operation on the second verified data to generate a third verified data if the layout versus layout verification is successfully performed, and the processor performs a Boolean check on the third verified data to generate a fourth verified data.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
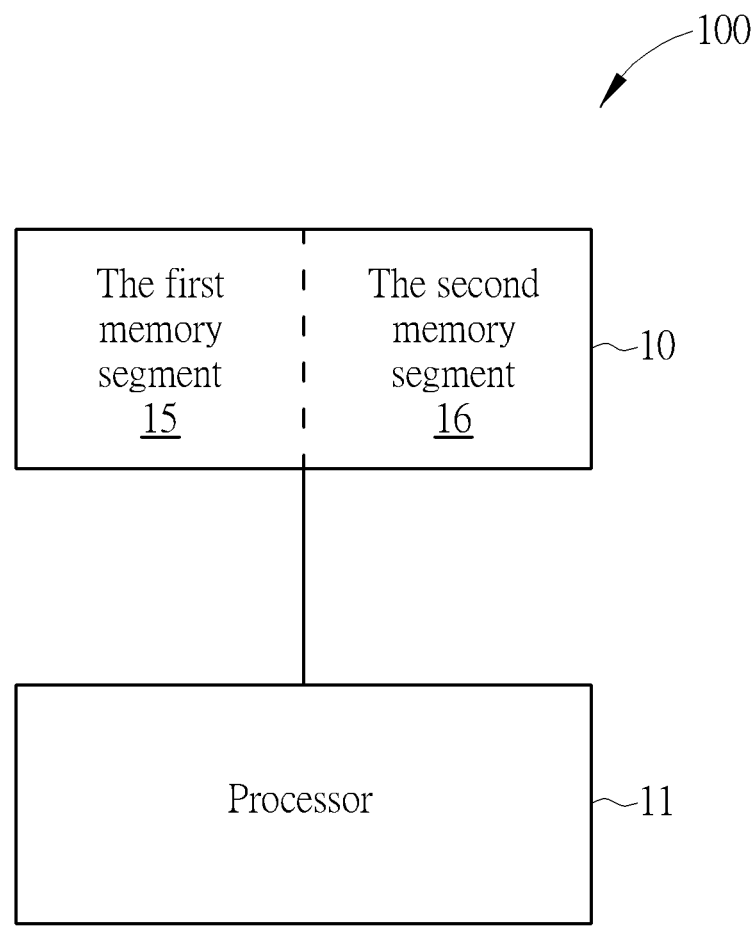
FIG. 1 is a schematic block diagram of an optical proximity correction verification system according to an embodiment of the present invention.

FIG. 1 is a schematic block diagram of an optical proximity correction verification system 100 according to an embodiment of the present invention. The optical proximity correction verification system 100 includes a memory 10 and a processor 11. The memory 10 includes a first memory segment 15 and a second memory segment 16. As shown in FIG. 1, the first memory segment 15 and a second memory segment 16 are formed in the memory 10, but the invention is not limited thereto. In another embodiment, the first memory segment 15 and a second memory segment 16 can be formed in distinct memories. The processor 11 is coupled to the first memory segment 15 and the second memory segment 16. The optical proximity correction verification system 100 in the invention can be a verification system in the form of a work station, or a verification system of computer. The first memory segment 15 is used for loading a layout data to be verified. Such the layout data to be verified is an external data provided outside the optical proximity correction verification system 100. For example, the layout data has already been designed by the developer. The second memory segment 16 is used for loading a reference layout data. Such the reference layout data contains various layout models designed by the designer, functions of the verification tool (i.e., for example, the software tool of Electronic Design Automation), or reference data of various combinations of Boolean expressions. The processor 11 performs several steps of verification on the layout data to be verified according to the second memory segment 16. In the following, the steps of verification are illustrated in detail.

Figure 2:
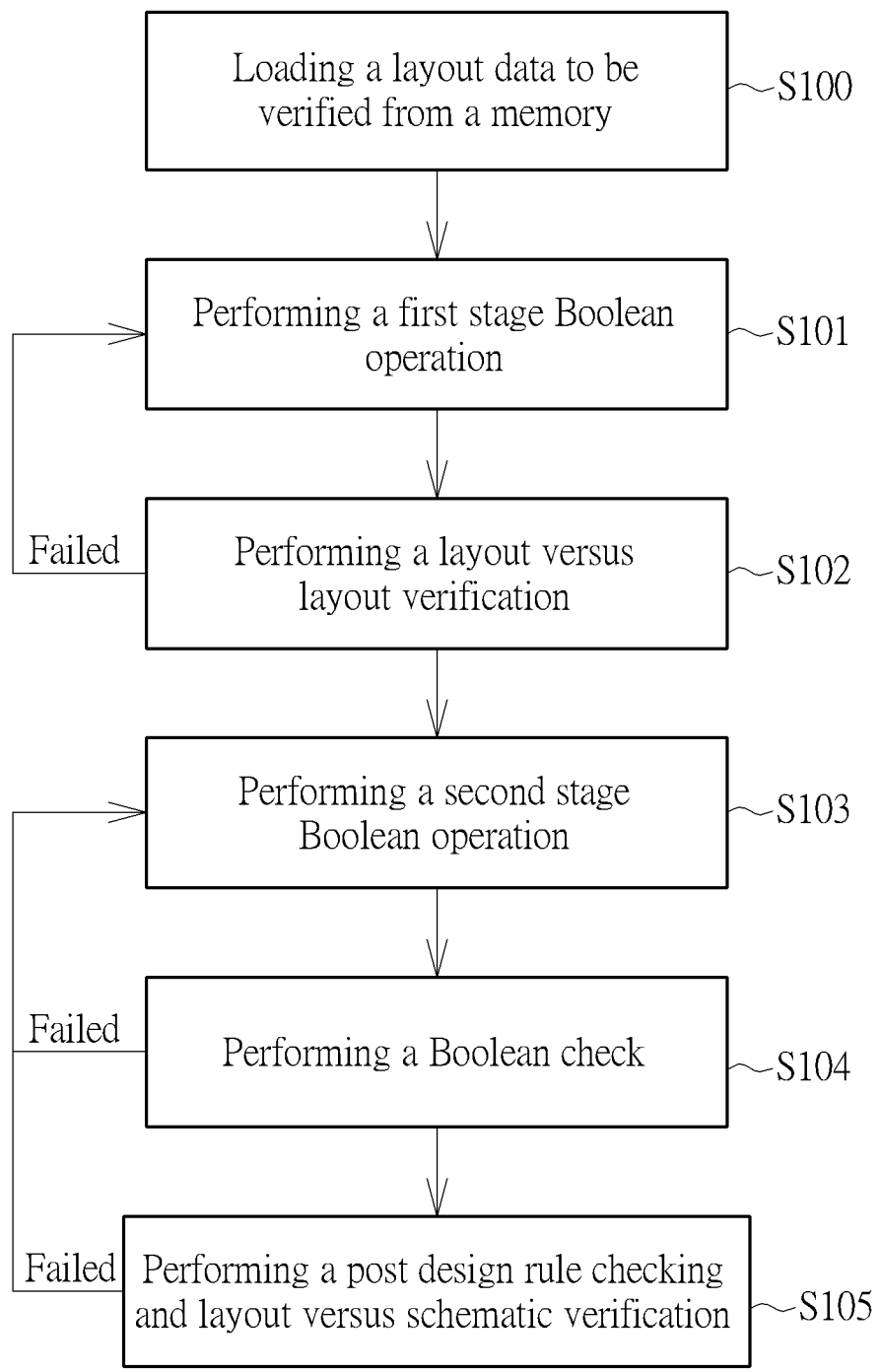
FIG. 2 is a flow chart of an optical proximity correction verification method according to the first embodiment of the present invention.

FIG. 2 is a flow chart of an optical proximity correction verification method according to the first embodiment of the present invention. As shown in FIG. 2, six steps are introduced to optical proximity correction verification method, as:
step S100: loading a layout data to be verified from a memory;
step S101: performing a first stage Boolean operation;
step S102: performing a layout versus layout verification;
step S103: performing a second stage Boolean operation;

step S104: performing a Boolean check; and step S105: performing a post design rule checking and layout versus schematic verification.

In step S100, the optical proximity correction verification system 100 loads the layout data to be verified from the first memory segment 15 in the memory 10. The layout data to be verified can comprise at least two formats but not be limited thereto, including the old format called by GDSII and the new format called by OASIS. Then, the layout data to be verified is operated by the first stage Boolean operation in step S101. Specifically, only Boolean expressions corresponding to the layout data to be verified are operated by the first stage Boolean operation process in step S101. The first stage Boolean operation is irrelevant to the operations of component geometry sizing adjustment of layout data. For example, to manufacture a gate layer, the Boolean expression can be written by: Gate=Poly and Diffusion. The first stage Boolean operation verifies if the Boolean expression is valid and operates the Boolean expression. If the Boolean expression verified by the first stage Boolean operation is expressed as Gate=mental2 and Diffusion, the Boolean expression is detected as an invalid Boolean expression. Specifically, since the first stage Boolean operation is irrelevant to the operations of component geometry sizing adjustment of layout data, the first stage Boolean operation belongs to a Boolean operation with respect to the data of non-sizing layout. After performing the first stage Boolean operation, the optical proximity correction verification system 100 performs the layout versus layout verification on the layout data to be verified in step S102. In step S102, the optical proximity correction verification system 100 loads the reference layout data from the second memory segment 16 in the memory 10. The reference layout data is a predefined layout data built in the optical proximity correction verification system 100 of this embodiment. In step S102, the layout versus layout verification is performed on every layer of the predefined layout data and the layout data to be verified. For example, the layout versus layout verification is to compare the layout of each layer of the layout data to be verified with the reference layout data by using an exclusive-or operator.

When the step S102 in the optical proximity correction verification system 100 is successfully performed, the verification proceeds to step S103. Particularly, the results in step S102 can be used to decide if the optical proximity correction verification system 100 proceeds to step S103. In step S103, the optical proximity correction verification system 100 uses the second stage Boolean operation to process the layout data. The second stage Boolean operation is relevant to the operations of component geometry sizing adjustment of layout data. For example, when the Boolean expression corresponding to the layout data is written by: Gate1=SizeGate−5, it implies that the size of gate of the output layout data is changed. The second Boolean operation verifies and then executes this Boolean expression. Since the second stage Boolean operation is relevant to the operations of component geometry sizing adjustment of layout data, the second stage Boolean operation belongs to a Boolean operation with respect to the data of sizing layout. Then, the optical proximity correction verification system 100 performs the Boolean check in step S104. The Boolean check detects all pattern (components) combinations in the layout data and verifies them if they are formed in invalid combinations. Finally, in step S105, the optical proximity correction verification system 100 performs the post design rule checking and layout versus schematic verification to verify if all parameters of the layout data conform to their definitions. However, the step S105 in the optical proximity correction verification system 100 is not essential. In other embodiments, the step S105 can be omitted.

Further, in the embodiment, if the layout versus layout in step S102 fails, the optical proximity correction verification system 100 returns the current verification step to the first stage Boolean operation in step S101 for fixing the errors. Similarly, if the Boolean check in step S104 or the post design rule checking and layout versus schematic verification in step S105 fails, the optical proximity correction verification system 100 returns the current verification step to the second stage Boolean operation in step S103 for fixing the errors.

Figure 3:
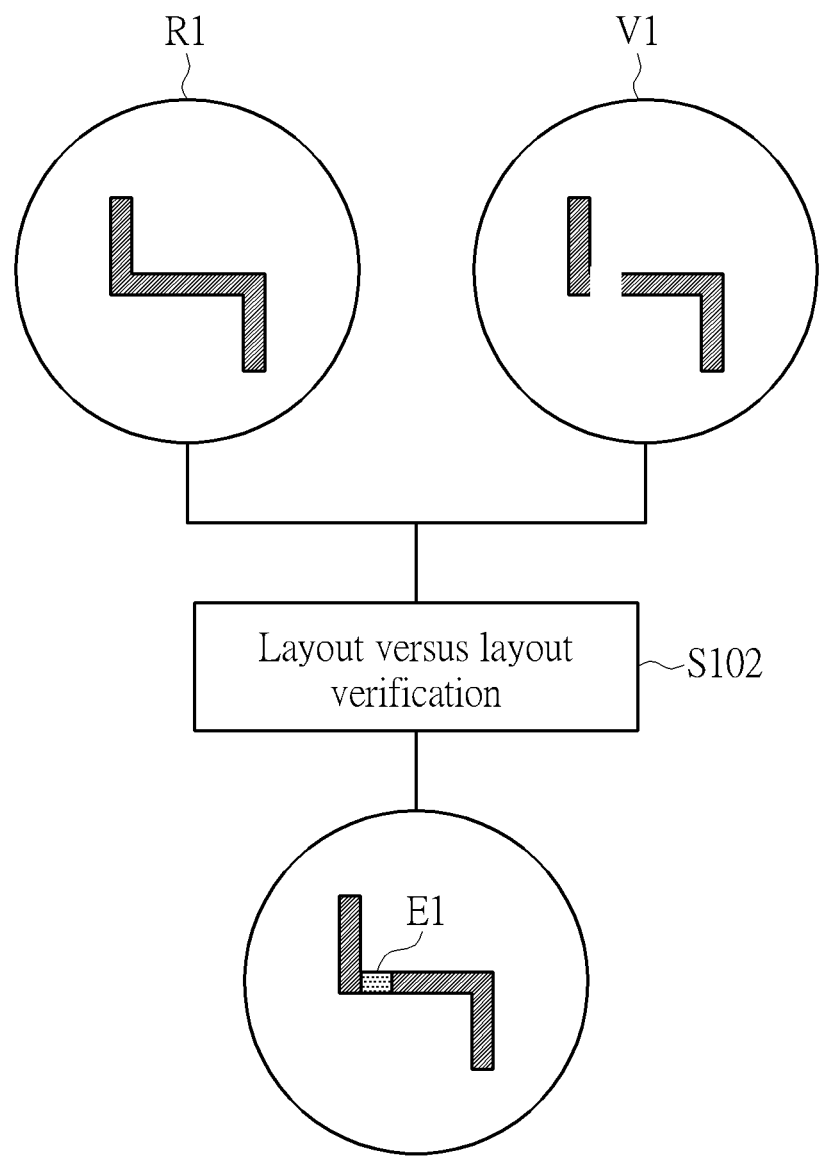
FIG. 3 illustrates an example of layout versus layout verification according to the embodiment of FIG. 2.
Figure 4:
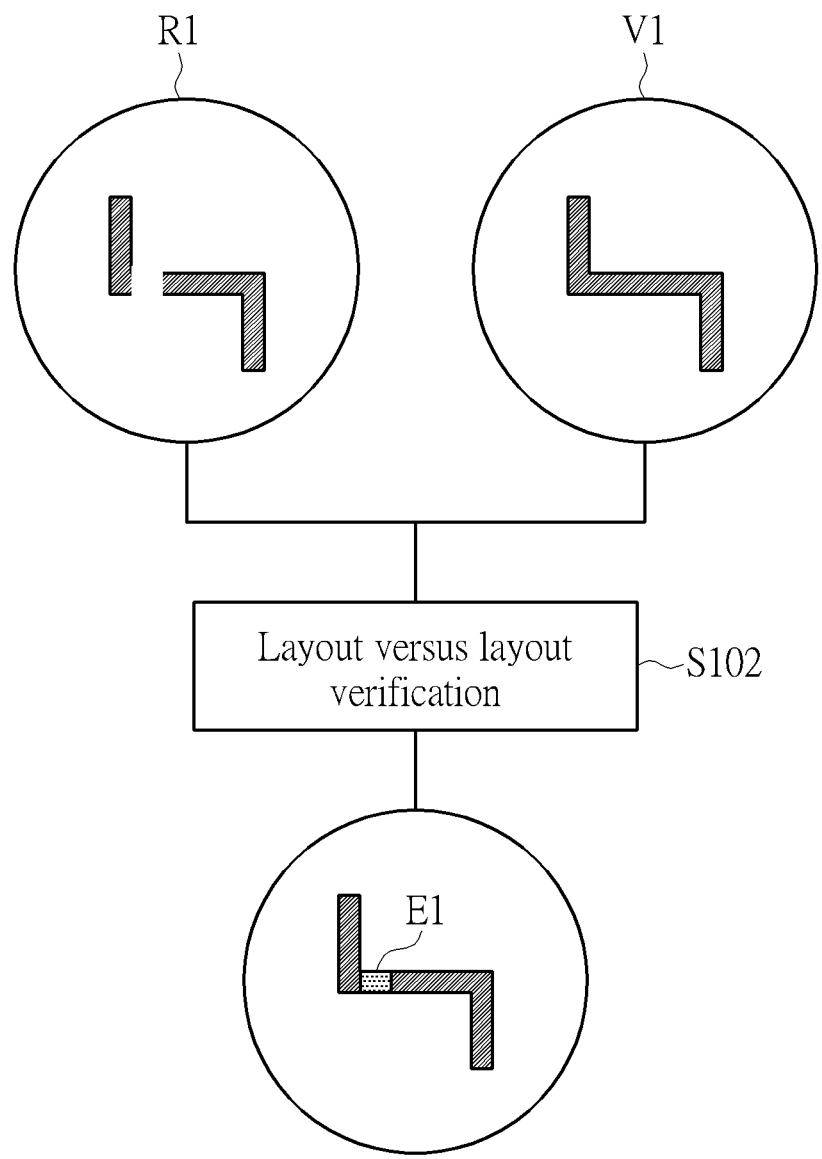
FIG. 4 illustrates another example of layout versus layout verification according to the embodiment of FIG. 2.

In the following, the comparison with the layout data to be verified and the reference layout data by using an exclusive-or operator in layout versus layout verification (step S102) is illustrated. FIG. 3 illustrates an example of layout versus layout verification in step S102. As shown in FIG. 3, the layout data to be verified is assumed that the layout data is already designed by the developer and need to be verified, denoting as layout data V1. The reference layout data is stored in the memory, denoting as layout data R1. By comparing the layout data V1 with the layout data R1, the open circuit exists. Thus, when the processor compares the layout data V1 with the layout data R1 in step S102 by using the layout versus layout verification, it can be detected that the circuit error is occurred at the point E1 according to the exclusive-or operator. Thus, the optical proximity correction verification system 100 sends out an open detecting warning and goes back to step S101 to fix this error. Conversely, as shown in FIG. 4, by comparing the layout data V1 with the layout data R1 in step S102, the short circuit exists. Thus, when the processor compares the layout data V1 with the layout data R1 in step S102 by using the layout versus layout verification, it can be detected that the circuit error is occurred at the point E1 according to the exclusive-or operator. Thus, the optical proximity correction verification system 100 sends out a short detecting warning and goes back to step S101 to fix this error.

Figure 5:
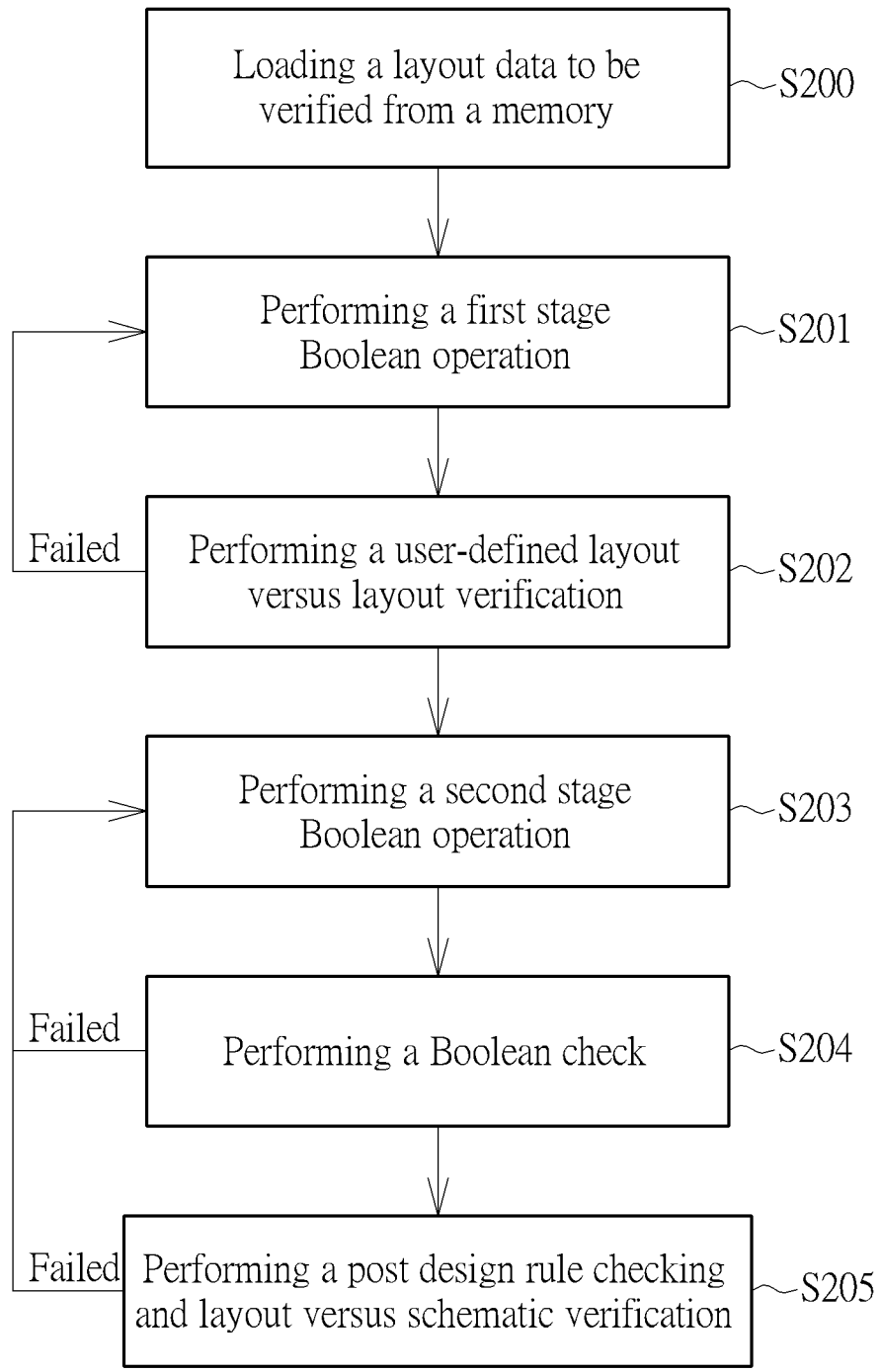
FIG. 5 is a flow chart of an optical proximity correction verification method according to the second embodiment of the present invention.

FIG. 5 is a flow chart of an optical proximity correction verification method according to the second embodiment of the present invention. As shown in FIG. 5, six steps are introduced to optical proximity correction verification method, as:

step S200: loading a layout data to be verified from a memory;

step S201: performing a first stage Boolean operation;

step S202: performing a user-defined layout versus layout verification;

step S203: performing a second stage Boolean operation;

step S204: performing a Boolean check; and step S205: performing a post design rule checking and layout versus schematic verification.

The optical proximity correction verification method in the embodiment is similar to the optical proximity correction verification method in the first embodiment. Step S200, step S201, step S203, step S204, and step S205 are the same as step S100, step S101, step S103, step S104, and step S105 of the optical proximity correction verification method in the first embodiment. Thus, the illustrations of those steps are omitted. The main difference between the second embodiment and the first embodiment is that the layout versus layout verification becomes user-defined layout versus layout verification. It means that user can designate the specific layer for controlling the layout versus layout verification of the embodiment. For example, user can establish a programming code with respect to the layout versus layout verification for verify layout data. Further, in the embodiment, as shown in FIG. 5, if the user-defined layout versus layout fails in step S202, the optical proximity correction verification system 100 returns the current verification step to the first stage Boolean operation in step S201 for fixing the errors. Similarly, if the Boolean check in step S204 or the post design rule checking and layout versus schematic verification in step S205 fails, the optical proximity correction verification system 100 returns the current verification step to the second stage Boolean operation in step S203 for fixing the errors. In the first embodiment, the layout versus layout verification lacks capability for manually controlling and designating the layer. The layout versus layout verification is applied to all defined layers progressively so that some Boolean operation errors (i.e., for example, definition errors) on certain layers are undetectable by using the layout versus layout verification in the first embodiment. In the second embodiment, user can designate the specific layer in the layout versus layout verification. By manually controlling and designating the layer, the layout versus layout verification is able to detect layer definition errors of layout, as the following illustrations.

Figure 6:
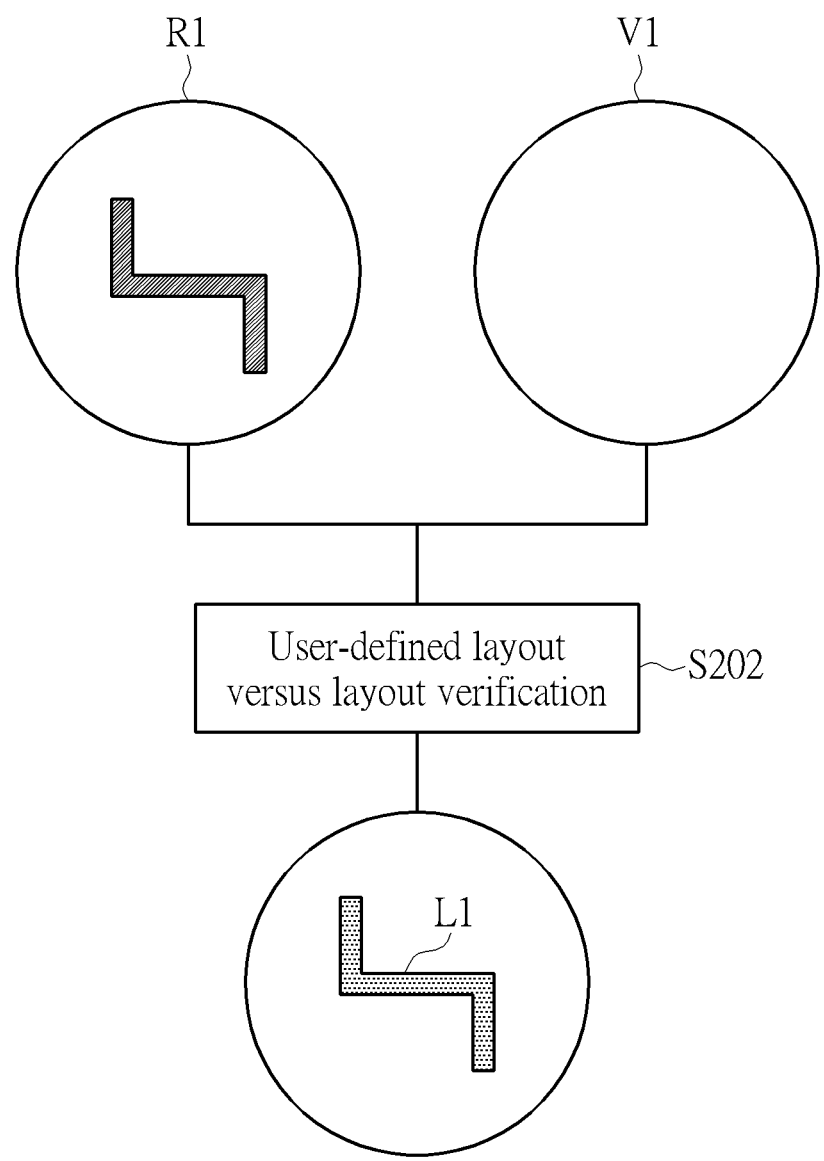
FIG. 6 illustrates an example of user-defined layout versus layout verification according to the embodiment of FIG. 5.
Figure 7:
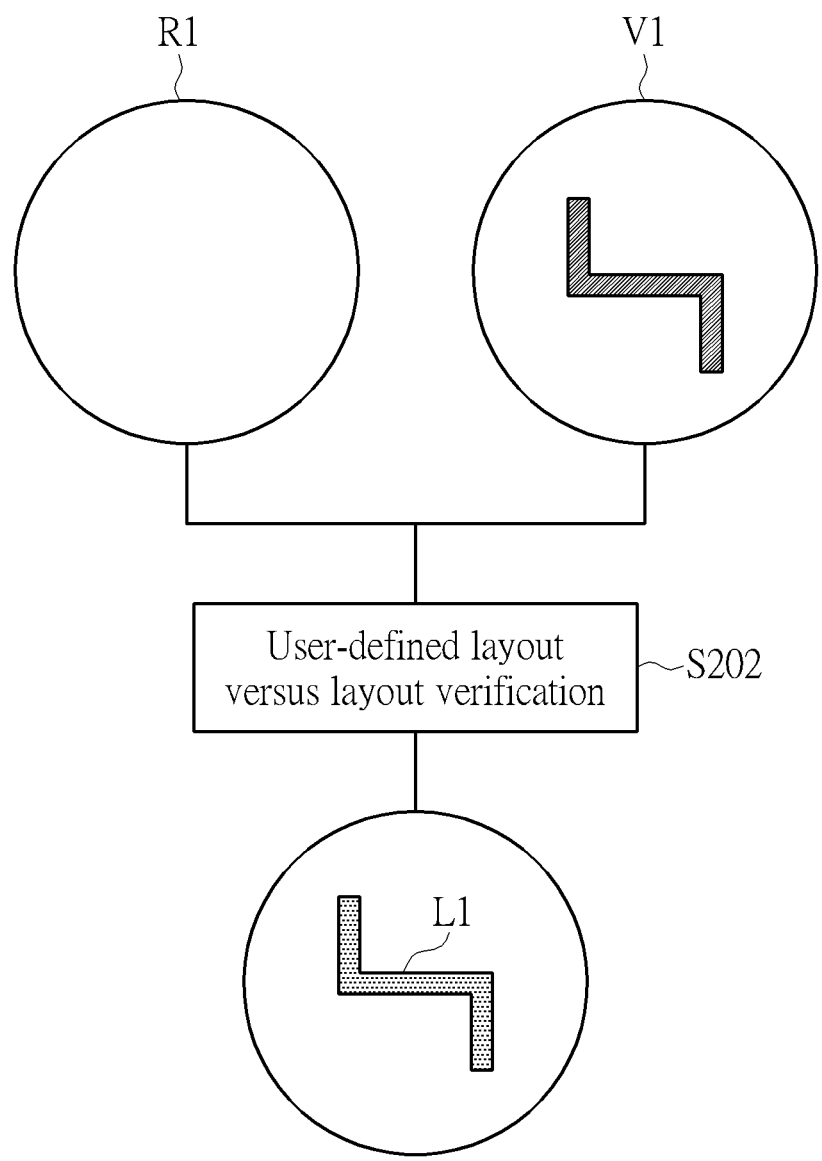
FIG. 7 illustrates another example of user-defined layout versus layout verification according to the embodiment of FIG. 5.

FIG. 6 illustrates an example of user-defined layout versus layout verification according to the second embodiment of the present invention. As shown in FIG. 6, the layout data to be verified denotes as layout data V1. The reference layout data denotes as layout data R1. In the embodiment, when the layout data V1 and the layout data R1 have different layers (i.e., for example, layout data R1 is corresponding to layer A and layout data V1 is corresponding to layer B), if the layout corresponding to layer A is chosen to be a correct layer, the user-defined layout versus layout verification can be designated to layer A. In FIG. 6, the circuit line passes through the layout of the layout data R1. However, no circuit line passes through the layout of the layout data V1. When the layout data V1 and the layout data R1 are compared by using the layout versus layout verification in step S202, it can be detected that the circuit error is occurred at the circuit line L1 according to the exclusive-or operator. Thus, the optical proximity correction verification system 100 sends out an extra layer detecting warning and goes back to step S201 to fix this error. Conversely, as shown in FIG. 7, no circuit line passes through the layout of the layout data R1. However, the circuit line passes through the layout of the layout data V1. When the layout data V1 and the layout data R1 are compared by using the layout versus layout verification in step S202, it can be detected that the circuit error is occurred at the circuit line L1 according to the exclusive-or operator. Thus, the optical proximity correction verification system 100 sends out a lost layer detecting warning and goes back to step S201 to fix this error.

Figure 8:
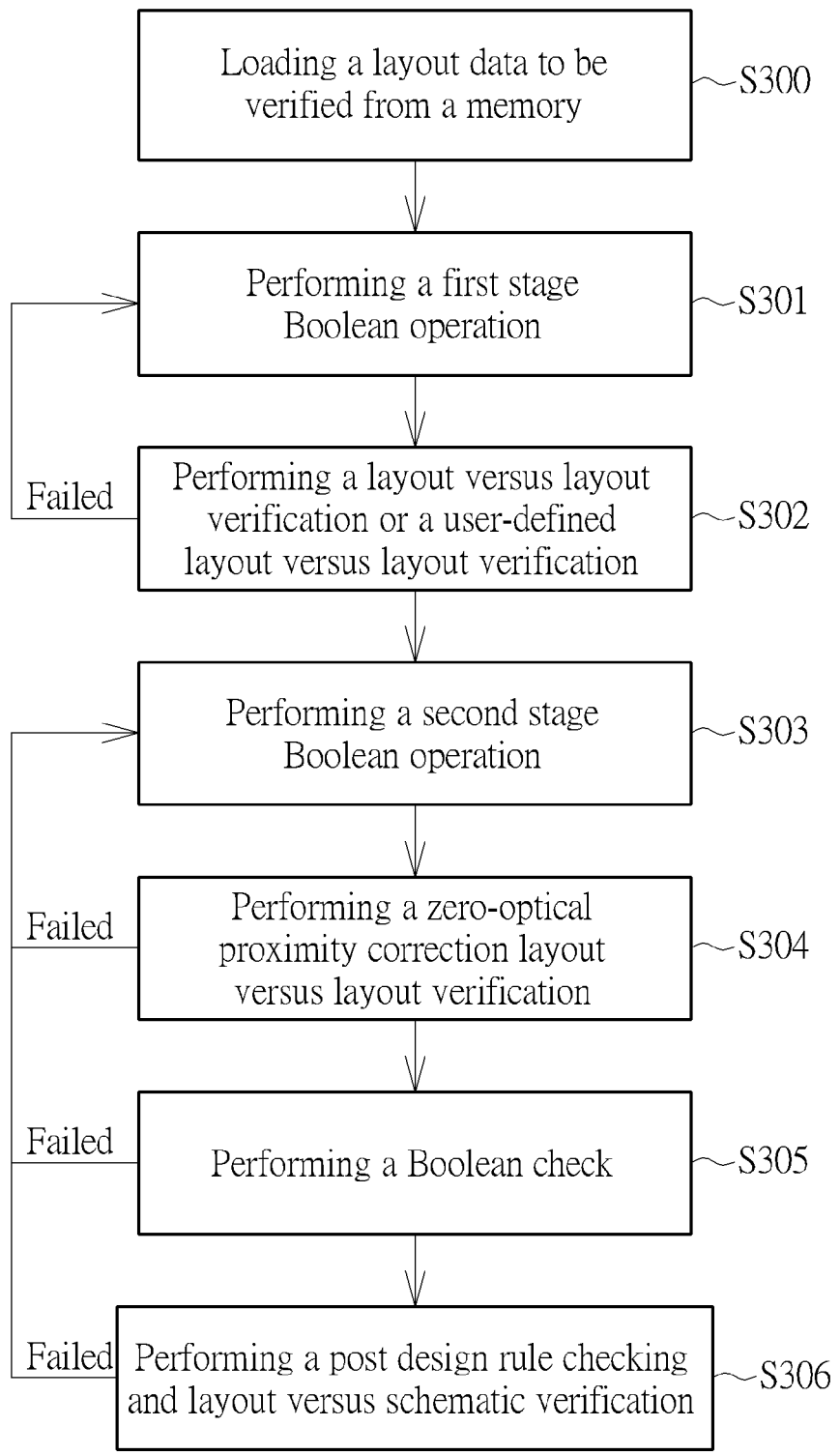
FIG. 8 is a flow chart of an optical proximity correction verification method according to the third embodiment of the present invention.

FIG. 8 is a flow chart of an optical proximity correction verification method according to the third embodiment of the present invention. As shown in FIG. 8, seven steps are introduced to optical proximity correction verification method, as:
step S300: loading a layout data to be verified from a memory;
step S301: performing a first stage Boolean operation;
step S302: performing a layout versus layout verification or a user-defined layout versus layout verification;
step S303: performing a second stage Boolean operation;
step S304: performing a zero-optical proximity correction layout versus layout verification;
step S305: performing a Boolean check; and
step S306: performing a post design rule checking and layout versus schematic verification.

The optical proximity correction verification method in the embodiment is similar to the optical proximity correction verification method in the first embodiment. Step S300, step S301, step S303, step S305, and step S306 are the same as step S100, step S101, step S103, step S104, and step S105 of the optical proximity correction verification method in the first embodiment. Thus, the illustrations of those steps are omitted. Step S302 can be chosen as the same method of step S102 in the first embodiment or step S202 in the second embodiment. Thus, the illustrations of step S302 are also omitted. The main difference between the embodiment and the above embodiments is that the zero optical proximity correction verification is introduced to step S304. The zero optical proximity correction verification is described as follows. Like above embodiments, the second Boolean operation in step S303 is relevant to the operations of component geometry sizing adjustment of layout data and thus belongs to a Boolean operation with respect to the data of sizing layout. Specifically, after performing the second Boolean operation, the verification system (i.e., for example, electronic design automation system) generates the corresponding parameters. Such parameters include the adjusted values of the sizes of components (i.e., for example, the parameters are corresponding to the difference values of the sizes of components between the layout providing from the customer and the layout modifying from the foundry). For instance, a circuit line with initial width L and adjusted value K denotes the width of circuit line being outputted having size L-K. When K is equal to zero, it implies that the width size of circuit line of the outputted layout is equal to the original size of circuit line of layout. In the embodiment, in the step S304 of the optical proximity correction verification method, the size adjusted parameters are set into zero for verifying if every size of component of the layout is equal to the original size of component of layout. In brief, the layout versus layout verification in the embodiment, step S302 belongs to the comparisons of data of non-sizing layout and step S304 belongs to the comparisons of data of sizing layout. Specifically, in the embodiment, since the step S302 can be chosen as the same method of step S102 of the first embodiment or step S202 of the second embodiment, when the method of step S102 of the first embodiment is applied to the step S302, step S302 has the detected capability illustrated as FIG. 3 and FIG. 4. When the method of step S202 of the second embodiment is applied to the step S302, step S302 has the detected capability illustrated as FIG. 3 and FIG. 4 in conjunction with the detected capability illustrated as FIG. 6 and FIG. 7.

Further, in the embodiment, as shown in FIG. 8, if the layout versus layout or user-defined layout versus layout fails in step S302, the optical proximity correction verification system 100 returns the current verification step to the first stage Boolean operation in step S301 for fixing the errors. Similarly, if the zero optical proximity correction of layout versus layout verification in step S304, Boolean check in step S305, or the post design rule checking and layout versus schematic verification in step S306 fails, the optical proximity correction verification system 100 returns the current verification step to the second stage Boolean operation in step S303 for fixing the errors.

To sum up, an optical proximity correction verification system and a verification method are disclosed in the invention. The idea is to use two stages of Boolean operations for respectively performing the optical proximity correction verification with respect to a data of non-sizing layout and a data of sizing layout. Further, the layout versus layout verification can use the predefined layout data (or functions) built in the verification tool or user-defined layout data (or functions) established by user. Thus, some Boolean operation errors on certain layer can be detected by manually controlling and designating the layer verifications. As a result, the optical proximity correction verification method in the invention can decrease the detected error rate and provide high flexibility of design.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optical proximity correction verification method comprising:
   loading a layout data to be verified to a processor;
   loading a reference layout data to the processor;
   the processor performing a first stage Boolean operation on the layout data to be verified to generate a first verified data;
   the processor performing a layout versus layout verification on the first verified data by using a default verification tool of optical proximity correction data in a database to generate a second verified data by using the reference layout data;
   the processor performing a second stage Boolean operation on the second verified data to generate a third verified data if the layout versus layout verification is successfully performed; and
   the processor performing a Boolean check on the third verified data to generate a fourth verified data by using the reference layout data.

2. The method of claim 1, wherein the layout versus layout verification is to compare the layout of each layer of the layout data to be verified with the reference layout data by using an exclusive-or operator.

3. The method of claim 1, wherein the first stage Boolean operation is a Boolean operation with respect to a data of a non-sizing layout.

4. The method of claim 1, wherein the second stage Boolean operation is a Boolean operation with respect to a data of sizing layout.

5. The method of claim 1, further comprising:
   the processor performing a zero-optical proximity correction layout versus layout verification on the third verified data to verify the third verified data.

6. The method of claim 5, wherein the zero-optical proximity correction layout versus layout verification is to zero a plurality of size-adjusted values of layout in the third verified data generated after performing the second stage Boolean operation on the second verified data.

7. An optical proximity correction verification system comprising:
   a first memory segment for loading a layout data to be verified;
   a second memory segment for loading a reference layout data; and
   a processor coupled to the first memory segment and the second memory segment;
   wherein the processor performs a first stage Boolean operation on the layout data to be verified to generate a first verified data, the processor performs a layout versus layout verification on the first verified data by using a default verification tool of optical proximity correction data in the second memory segment to generate a second verified data by using the reference layout data, the processor performs a second stage Boolean operation on the second verified data to generate a third verified data if the layout versus layout verification is successfully performed, and the processor performs a Boolean check on the third verified data to generate a fourth verified data.

8. The system of claim 7, wherein the processor further performs a zero-optical proximity correction layout versus layout verification on the third verified data to verify the third verified data by using the reference layout data.

9. The system of claim 7, wherein the first stage Boolean operation is a Boolean operation with respect to a data of a non-sizing layout.

10. The system of claim 7, wherein the second stage Boolean operation is a Boolean operation with respect to a data of sizing layout.

* * * * *